(12) United States Patent
Lee

(10) Patent No.: US 11,914,282 B2
(45) Date of Patent: Feb. 27, 2024

(54) SYSTEM OF MEASURING IMAGE OF PATTERN IN SCANNING TYPE EUV MASK

(71) Applicant: SAMSUNG ELECTRONICS CO., LTD., Suwon-si (KR)

(72) Inventor: Donggun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 310 days.

(21) Appl. No.: 17/509,454

(22) Filed: Oct. 25, 2021

(65) Prior Publication Data

US 2023/0131024 A1 Apr. 27, 2023

(51) Int. Cl.
  *G03F 1/24* (2012.01)
  *G01N 21/95* (2006.01)
  *G03F 7/00* (2006.01)

(52) U.S. Cl.
  CPC ............ *G03F 1/24* (2013.01); *G01N 21/9501* (2013.01); *G03F 7/7085* (2013.01); *G03F 7/70483* (2013.01); *G01N 2201/021* (2013.01); *G01N 2201/0636* (2013.01); *G01N 2201/06113* (2013.01)

(58) Field of Classification Search
  None
  See application file for complete search history.

(56) References Cited

U.S. PATENT DOCUMENTS

| | | | | |
|---|---|---|---|---|
| 11,533,799 B1 * | 12/2022 | Chen | ............... | H05G 2/005 |
| 2004/0029024 A1 * | 2/2004 | Ohnuma | ............ | G03F 7/70466 |
| | | | | 430/311 |
| 2007/0064997 A1 | 3/2007 | Itoh | | |
| 2011/0033025 A1 | 2/2011 | Lee et al. | | |
| 2011/0240863 A1 | 10/2011 | Lee et al. | | |
| 2012/0268159 A1 | 10/2012 | Cho et al. | | |
| 2013/0056642 A1 | 3/2013 | Lee et al. | | |
| 2013/0280643 A1 * | 10/2013 | Hsu | ............... | H01L 21/0337 |
| | | | | 430/5 |
| 2017/0017147 A1 * | 1/2017 | Shih | ............... | G03F 1/24 |
| 2020/0057389 A1 * | 2/2020 | Lin | ............... | G03F 7/70716 |
| 2020/0073225 A1 * | 3/2020 | Shih | ............... | G03F 1/46 |
| 2020/0097633 A1 * | 3/2020 | Mahajan | ............ | G06F 30/398 |

(Continued)

FOREIGN PATENT DOCUMENTS

| | | |
|---|---|---|
| KR | 10-0875569 B1 | 12/2008 |
| KR | 10-2009-0120121 A | 11/2009 |

(Continued)

*Primary Examiner* — Marcus H Taningco

(74) *Attorney, Agent, or Firm* — Sughrue Mion, PLLC

(57) ABSTRACT

A system of measuring an image of a pattern in a scanning type EUV mask may include a high-power laser output unit including a flat mirror and a spherical mirror, which are used to focus a high-power femto-second laser on a gas cell; a coherent EUV light generating portion generating a coherent EUV light; a pin-hole, a graphene filter, and a zirconium (Zr) filter; a stage; an x-ray spherical mirror configured to focus a coherent EUV light; a zone-plate lens placed between the stage and the x-ray spherical mirror; an x-ray flat mirror placed between the zone-plate lens and the x-ray spherical mirror; an order sorting aperture (OSA) placed on the stage and configured to transmit only a first-order diffraction light of the focused coherent EUV light; and a detector portion placed on the stage.

5 Claims, 7 Drawing Sheets

(56) References Cited

U.S. PATENT DOCUMENTS

| | | | | |
|---|---|---|---|---|
| 2020/0201192 | A1* | 6/2020 | Smorenburg | G03F 7/70625 |
| 2021/0335599 | A1* | 10/2021 | Liao | H01L 21/0274 |
| 2022/0317562 | A1* | 10/2022 | Liu | G03F 1/62 |
| 2023/0131024 | A1* | 4/2023 | Lee | G03F 1/24 |
| | | | | 250/372 |

FOREIGN PATENT DOCUMENTS

| | | | |
|---|---|---|---|
| KR | 10-2010-0130422 | A | 12/2010 |
| KR | 10-2011-0110578 | A | 10/2011 |
| KR | 10-2013-0044387 | A | 5/2013 |
| KR | 10-1811306 | B1 | 12/2017 |
| KR | 10-2020-0121545 | A | 10/2020 |

\* cited by examiner

All cell signals from detection portion of array cell structure are used to reconstruct Image LWR 1.5 nm
Contrast 46%

Only Dipole-shaped cell in detection portion of array cell structure are used to reconstruct Image LWR 0.9 nm
Contrast 71%

SYSTEM OF MEASURING IMAGE OF PATTERN IN SCANNING TYPE EUV MASK

BACKGROUND OF THE INVENTION

The present disclosure relates to a system of measuring an image of a pattern in a scanning type extreme ultraviolet (EUV) mask, which is used for a process of manufacturing a semiconductor device, and in particular, an EUV mask scanning microscope system which is used when a fine pattern is formed by an EUV exposure process that is one of semiconductor manufacturing processes.

An EUV exposure apparatus, which is used to fabricate a semiconductor device using an EUV light having a wavelength of 13.5 nm, is being exploited for a semiconductor fabrication process. By using the EUV exposure apparatus, it may be possible to effectively reduce a linewidth of a pattern, because the wavelength of the EUV light is shorter than a wavelength (e.g., 193 nm) of the Argon fluoride (ArF) light used in the conventional exposure apparatus.

In the EUV exposure apparatus using light of a short wavelength, an EUV mask is used as a photomask to form a fine pattern. The EUV mask may have a different structure from that in the conventional ArF exposure apparatus. For example, the EUV mask is changed from a transmission structure to a reflection structure and is provided to have an optimized reflectance to an EUV light having a wavelength of 13.5 nm.

A yield in a wafer-level process is directly affected by a process of inspecting and correcting a defect in patterns of the photomask, which is one of processes of manufacturing the EUV mask. This is because the defect on the photomask is copied to all of wafers fabricated using the EUV mask. A defect pattern, which is found by the mask inspection process, may be corrected by the correction process. An exposure process using a wafer exposure apparatus may be directly performed on a wafer, and then, a SEM inspection process may be performed to examine whether the correction is successful. However, this method requires a large amount of cost and a long evaluation time, and thus, in the current mask manufacturing process, a system, which has a microscope structure and is configured to measure an aerial image of a mask and to emulate an optical system in a wafer exposure apparatus, is used to cost-effectively evaluate influence of a pattern on a wafer.

Thus, in order to overcome these technical difficulties in the conventional technology, it is necessary to develop a mask measuring system, which can reduce cost and time in a mask manufacturing process, can measure an aerial image without a complex optical system for illumination, and can reconstruct aerial images for various illuminating conditions through a single measurement process.

PRIOR ART DOCUMENT

Patent Document (Patent Document 0001) KR 10-1811306
(Patent Document 0002) KR 10-0875569

SUMMARY

An embodiment of the inventive concept provides a high-performance aerial image measuring system for an EUV mask.

An embodiment of the inventive concept provides an aerial image measuring system, which is provided for an EUV mask, and to which a technology associated with a high-performance EUV optic system is applied.

An embodiment of the inventive concept provides an aerial image measuring system, which is provided for an EUV mask and includes an optical detector portion, which is provided as a part of a scanning-type microscope, and to which a sense array technology capable of perfectly emulating an inclined illuminating system(s) in an exposure apparatus is applied.

According to an embodiment of the inventive concept, a system of measuring an image of a pattern in a scanning type EUV mask may include a high-power laser output unit including a flat mirror and a spherical mirror, which are used to focus a high-power femto-second laser on a gas cell; a coherent EUV light generating portion including the gas cell, which is used to generate a coherent EUV light from light output from the laser output unit; a pin-hole, a graphene filter, and a zirconium (Zr) filter configured to remove a high-power laser beam from the generated EUV light; a stage, on which a reflection-type EUV mask is placed, and which is configured to move the reflection-type EUV mask in a direction of an x- or y-axis; an x-ray spherical mirror configured to focus a coherent EUV light on a zone-plate lens and thereby to improve optical efficiency; a zone-plate lens placed between the stage and the x-ray spherical mirror to focus a reflected portion of the coherent EUV light on a region of the reflection-type EUV mask; an x-ray flat mirror placed between the zone-plate lens and the x-ray spherical mirror to guide and reflect a beam, which is focused by the x-ray spherical mirror, to the zone-plate lens; an order sorting aperture (OSA) placed on the stage and configured to transmit only a first-order diffraction light of the focused coherent EUV light; and a detector portion placed on the stage and composed of a sensor array, which is configured to sense an energy distribution of the coherent EUV light according to an angle of a reflected portion of the coherent EUV light, when the transmitted first-order diffraction light, which is a portion of the focused coherent EUV light, is reflected by the region of the reflection-type EUV mask.

In an embodiment, the pin-hole, the graphene filter, and the zirconium (Zr) filter are simultaneously applied between first optical system in the high-power laser output unit and second first optical system including the x-ray flat mirror and the x-ray spherical mirror to filter an x-ray light from light including a femto-second laser beam and the x-ray light. The first optical system is an IR optical system before the pin-hole, the graphene filter, and the zirconium (Zr) filter. The second optical system is an EUV optical system after the pin-hole, the graphene filter, and the zirconium (Zr) filter.

In an embodiment, the pin-hole is a filter using a difference in emission angle between a femto-second laser and an x-ray light, the zirconium (Zr) filter is configured to use high selectivity between a laser light and an x-ray light, and the graphene filter is provided to have a good thermal durability and thereby to reduce a thermal damage issue in a subsequent step.

In an embodiment, all of the zone-plate lens, the order sorting aperture, and the reflection-type EUV mask are disposed in a horizontal structure, and the order sorting aperture is a pin-hole and is placed between the zone-plate lens and the EUV mask to transmit only the first-order diffraction light, among light focused on the EUV mask through the zone-plate lens.

Here, the order sorting aperture may be provided between the EUV mask and the detector portion, and in an embodiment, the order sorting aperture may not be provided between the EUV mask and the detector portion.

In an embodiment, a distance between the order sorting aperture and the reflection-type EUV mask is configured to be smaller than ⅛ of a distance between the zone-plate lens and the reflection-type EUV mask and to reduce a noise component, except for a focusing component, to a level smaller than 4%.

In addition, the zone-plate lens, which is used to focus the x-ray light on a pattern region of the mask, may have a structure, in which molybdenum (Mo) and silicon (Si) layers are alternatingly stacked, and a grating structure constituting the zone-plate lens may have an elliptical shape and may allow for focusing in an incidence direction, without changing a direction of the incident beam to an inclined direction.

Furthermore, the femto-second laser beam may be focused in a direction from right of the spherical mirror to left of the spherical mirror, and an output x-ray light may be focused in a direction from left of the x-ray spherical mirror to right of the x-ray spherical mirror.

DETAILED DESCRIPTION

Figure 1:
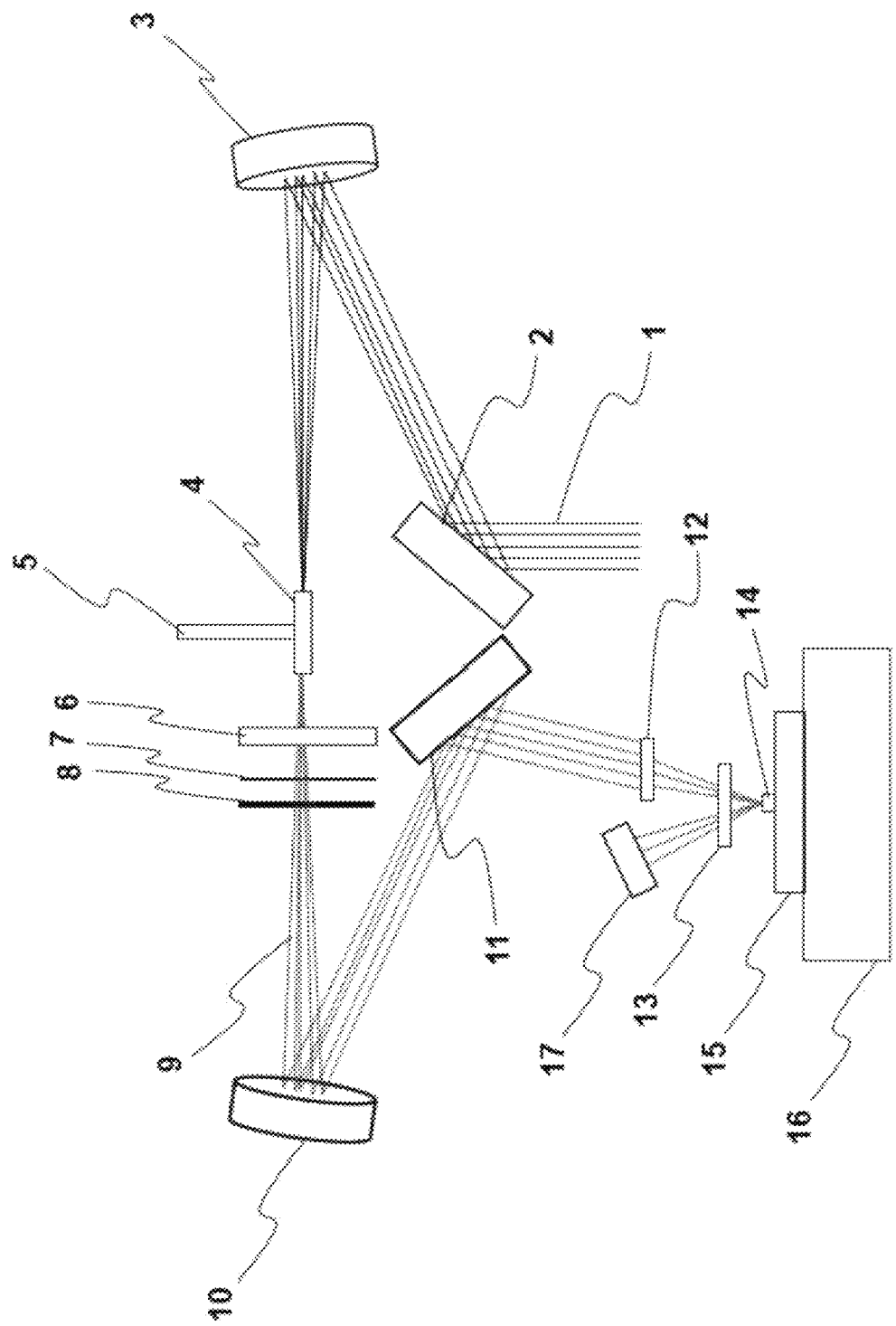
FIG. 1 is a diagram schematically illustrating a system of measuring an image of a pattern in a scanning type EUV mask, according to an embodiment of the inventive concept.

Hereinafter, a system of measuring an image of a pattern in a scanning type EUV mask according to an embodiment of the inventive concept will be described in more detail with reference to the accompanying drawings.

According to an embodiment of the inventive concept, a system of measuring an image of a pattern in a scanning type EUV mask may include a high-power laser output unit including a flat mirror and a spherical mirror, which are used to focus a high-power femto-second laser on a gas cell; a coherent EUV light generating portion including the gas cell, which is used to generate a coherent EUV light from light output from the laser output unit; a pin-hole, a graphene filter, and a zirconium (Zr) filter configured to remove a high-power laser beam from the generated EUV light; a stage, on which a reflection-type EUV mask is placed, and which is configured to move the reflection-type EUV mask in a direction of an x- or y-axis; an x-ray spherical mirror configured to focus a coherent EUV light on a zone-plate lens and thereby to improve optical efficiency; a zone-plate lens placed between the stage and the x-ray spherical mirror to focus a reflected portion of the coherent EUV light on a region of the reflection-type EUV mask; an x-ray flat mirror placed between the zone-plate lens and the x-ray spherical mirror to guide and reflect a beam, which is focused by the x-ray spherical mirror, to the zone-plate lens; an order sorting aperture (OSA) placed on the stage and configured to transmit only a first-order diffraction light of the focused coherent EUV light; and a detector portion placed on the stage and composed of a sensor array, which is configured to sense an energy distribution of the coherent EUV light according to an angle of a reflected portion of the coherent EUV light, when the transmitted first-order diffraction light, which is a portion of the focused coherent EUV light, is reflected by the region of the reflection-type EUV mask.

According to an embodiment of the inventive concept, an aerial image device may include four portions; 1) a light generating portion including an Infrare(IR) source 1 and a gas cell 4 1 generating EUV light in high efficiency, 2) an x-ray optical system portion (e.g., a flat mirror or a spherical mirror) delivering the generated x-ray light and/or EUV light to a zone-plate lens 12 in high efficiency or with high optical performance, 3) a hybrid stage portion including a coarse stage, which is used to find a position of an EUV mask 15 to be measured, and a fine stage, which is used to perform a scanning operation for forming an image, and 4) an optical detector portion or a sensor array 17 configured to perfectly emulate an inclined illuminating part of an exposure apparatus.

Thus, the EUV mask measuring device according to an embodiment of the inventive concept may be configured to improve a light generating property and efficiency of an optical system, and in this case, it may be possible to improve performance of an aerial image measuring system. By using an array detection method, it may be possible to realize desired performance in the measurement, without a complex illumination system for emulating an illuminating system of an exposure apparatus.

FIG. 1 is a diagram schematically illustrating a system of measuring an image of a pattern in a scanning type EUV mask, according to an embodiment of the inventive concept. In an EUV light generating portion, an x-ray light may be generated by focusing a femto-second laser on a gas in a gas cell 4, i.e. a higher order harmonic generation, and in order to prevent a chirping phenomenon, in which a pulse width is increased when the femto-second laser passes through a material, a spherical mirror, instead of a lens, may be used to focus the femto-second laser on the gas.

To remove other light excluding an x-ray light emitted from an exit of the gas cell 4 including a gas supplying line 5, a pin-hole 6 may be placed after the gas cell 4 to transmit an x-ray having a small beam emission angle and to transmit only a central portion of a femto-second laser light whose emission angle is greater than that of the x-ray. If the femto-second laser light passed through the pin-hole 6 is directly incident into a zirconium filter 8, the zirconium filter 8 may be thermally damaged. Thus, a graphene layer (e.g., composed of only carbon) having a good thermal resistance property may be used to absorb most of the femto-second laser light and to transmit the x-ray light. A weak femto-second laser light passed through a graphene filter 7 may cause a noise in a highly-sensitive detection sensor, and thus, the zirconium filter may be used to completely remove the femto-second laser light and to transmit the x-ray light at high transmission ratio.

Figure 2:
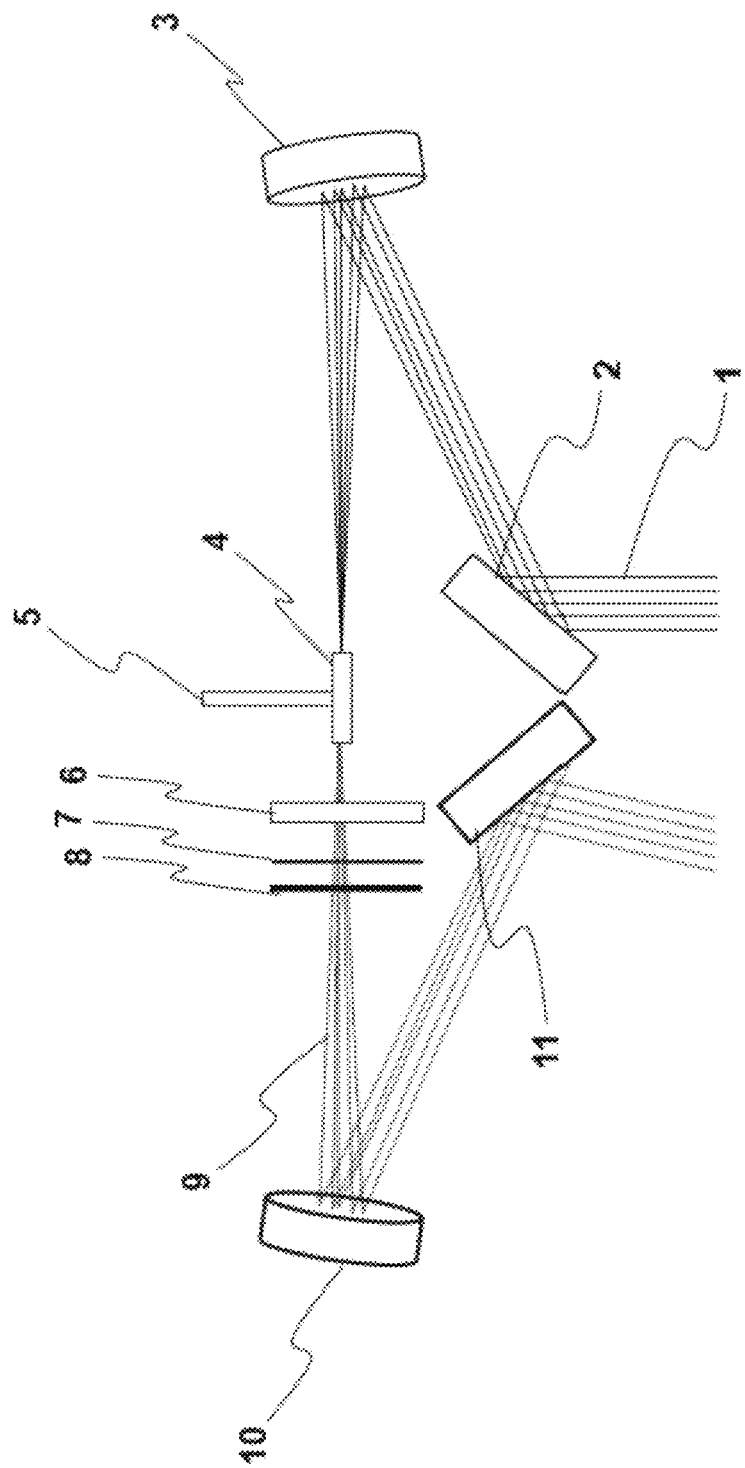
FIG. 2 is a diagram illustrating an example of a light-transmission structure in the system of measuring an image of a pattern in a scanning type EUV mask, according to an embodiment of the inventive concept.

FIG. 2 is a diagram illustrating an example of a light-transmission structure in the system of measuring an image of a pattern 14 in a scanning type EUV mask, according to an embodiment of the inventive concept.

Figure 5:
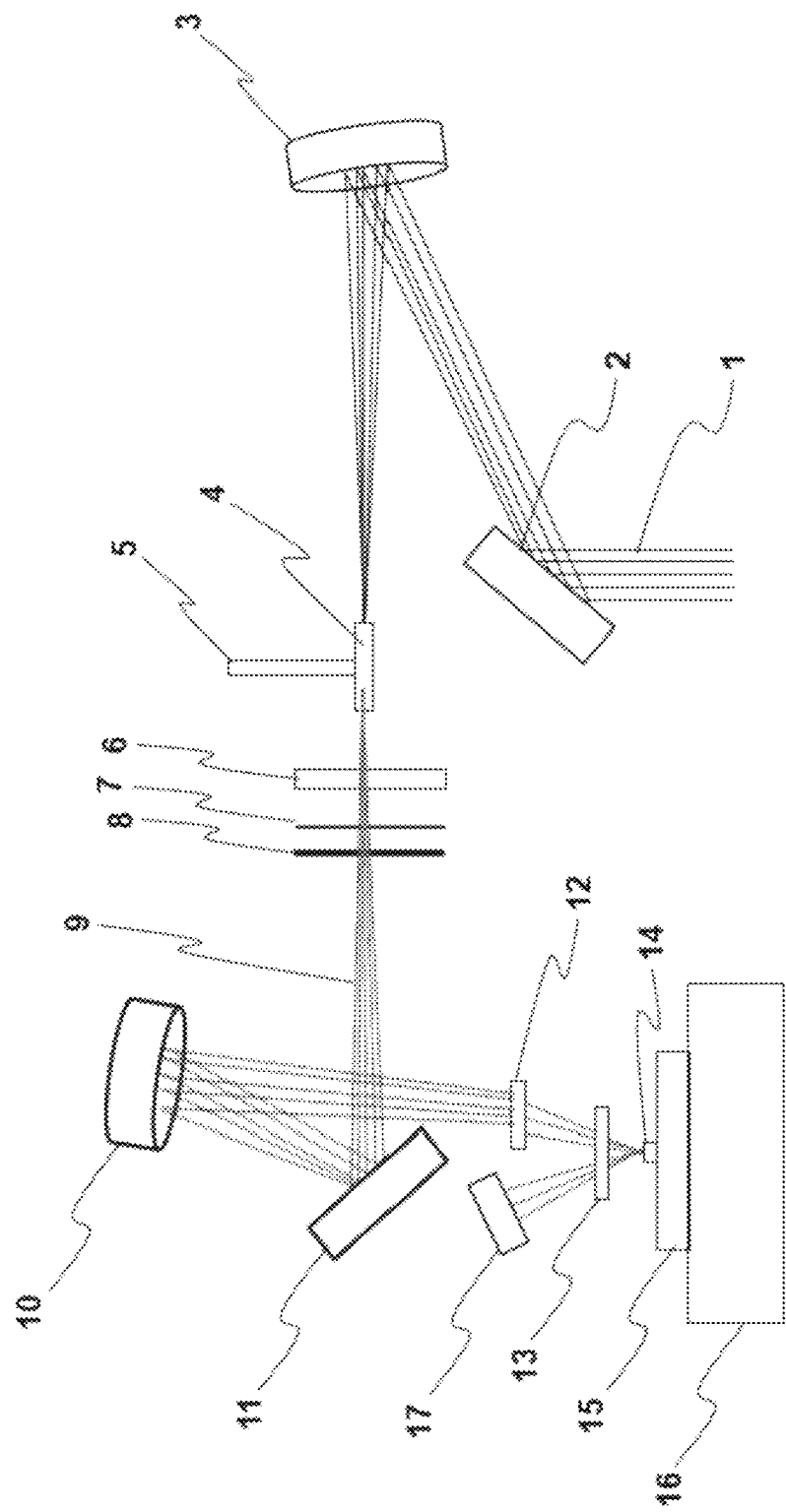
FIG. 5 is a diagram illustrating an example, in which an x-ray spherical mirror and an x-ray flat mirror are placed in a different order from that in FIG. 1, according to another embodiment of the inventive concept.

In an EUV optic portion, a focusing x-ray spherical mirror 10 (or a spherical condenser mirror) may be used to reflect an x-ray light 9, from which a noise is removed, to a flat x-ray flat mirror 11 (or a x-ray flat mirror 11 may be used to reflect an x-ray light 9, from which a noise is removed, to a x-ray spherical mirror 10 as in FIG. 5) and to focus light, which is incident into the spherical focusing mirror 10 and has an incident angle smaller than 3°, on a region of the zone-plate lens 12. a x-ray flat mirror 11 may be used to reflect an x-ray light 9, from which a noise is removed, to a x-ray spherical mirror 10 and to focus light, Here, a size of the focused beam may be controlled by adjusting a radius of the x-ray spherical mirror 10. For example, a diameter of the focused beam may be adjusted to have a value similar to a diameter of zone-plate lens 12, and in this case, it may be possible to improve the beam efficiency of the zone-plate lens 12 and to optimize an amount of the x-ray.

Both of the spherical mirror 3, which is used to focus the femto-second laser on the gas cell 4, and the x-ray-purposed spherical mirror 10, which is used to focus the x-ray light on the zone-plate lens 12, may be configured such that an angle of light incident thereto has an angle smaller than 3°, and this may make it possible to improve optical efficiency of the x-ray light focused on the zone-plate lens 12.

In addition, positions of the flat mirror, which is used to focus the high-power femto-second laser on the gas cell, and the spherical mirror may be exchanged, and similarly, positions of the x-ray spherical mirror, which is used to focus the coherent EUV light and to transmit the EUV beam to the zone-plate lens, and the flat mirror may be exchanged.

Furthermore, to improve efficiency in the process of collecting light, the spherical mirror 3 and the x-ray spherical mirror 10 may be placed to have an incident angle smaller than 3°, as described above.

Figure 3:
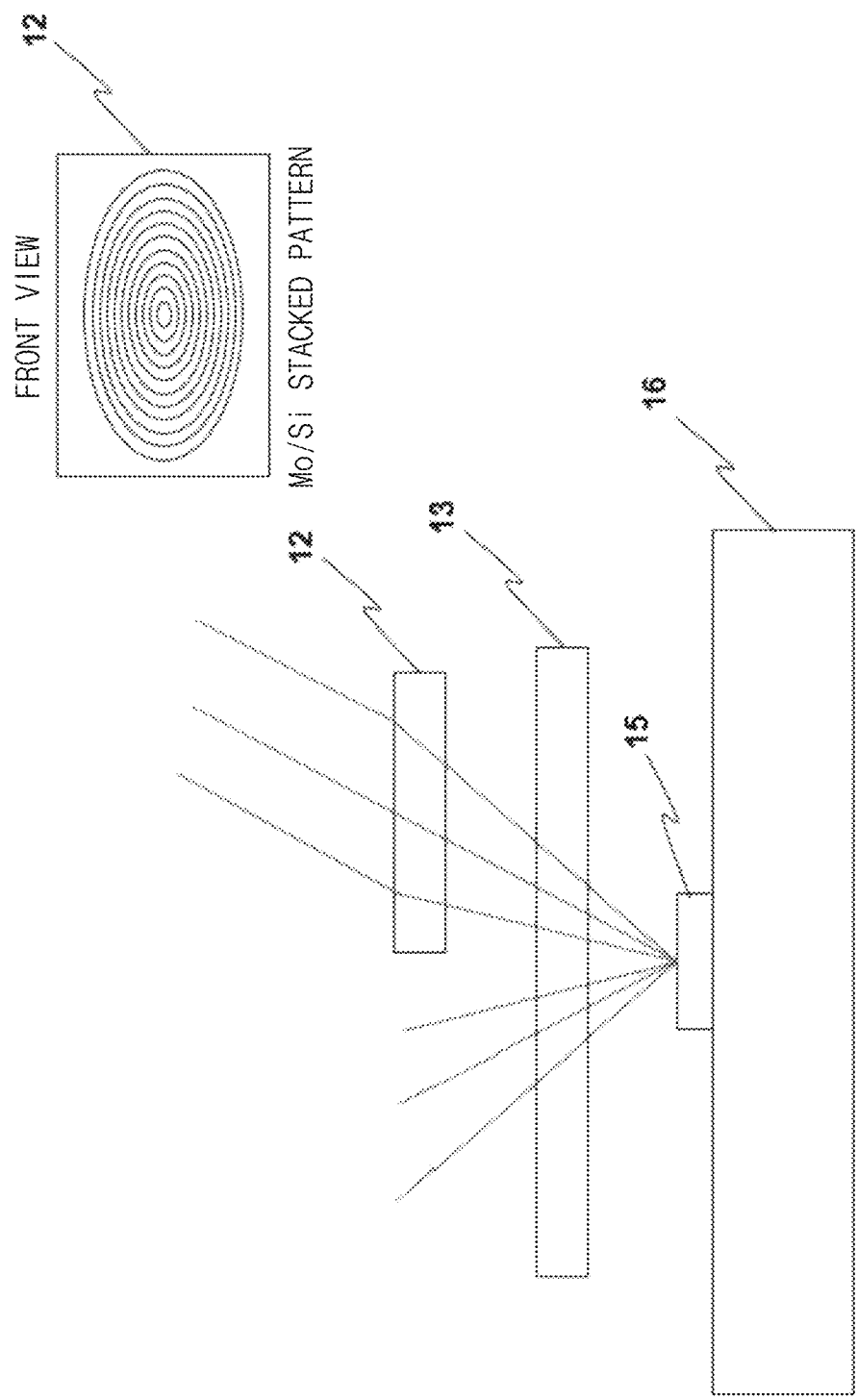
FIG. 3 is a diagram illustrating an example of a measurement target portion in the system of measuring an image of a pattern in a scanning type EUV mask, according to an embodiment of the inventive concept.

FIG. 3 is a diagram illustrating an example of a measurement target portion in the system of measuring an image of a pattern in a scanning type EUV mask, according to an embodiment of the inventive concept.

The zone-plate lens 12 may be a grating pattern, which is realized using a stacking structure of molybdenum (Mo) and silicon (Si), and may have a greatly improved diffraction efficiency for a first-order light, compared with a conventional zone-plate lens realized using gold (Au) or nickel (Ni).

If the conventional zone-plate lens of a circular pattern shape is inclined in an direction of an incident angle, it may be difficult to place the conventional zone-plate lens, due to a focusing distance issue and the consequent mechanical issue. However, the zone-plate lens 12 according to an embodiment of the inventive concept may be provided to have an elliptic pattern shape, and in this case, the zone-plate lens may be placed to be parallel to a mask surface. An order sorting aperture 13, which is used to focus the x-ray light on a mask pattern and to remove a noise light, not the first-order diffraction light, may be placed on a mask to be spaced apart from the mask by a distance smaller than ⅛ of a focal length of the zone-plate lens 12 and to be parallel to the mask, and in this case, it may be possible to maintain an amount of a noise light caused by a flare to a level of 4% or lower relative to a signal.

The EUV mask 15 may be scanned in both of the x and y directions through an operation of driving a fine stage and may be designed such that signals detected during the scanning operation are provided to a signal processing unit and an image thereof is reconstructed by an aerial image device, and this may make it possible to measure an aerial image. A coarse stage may be placed below the fine stage and may be configured to move the mask to a position of a desired image on the mask. According to an embodiment of the inventive concept, a stage 16 may include the fine stage and the coarse stage, and in this case, the stage 16 may be driven with an improved accuracy.

Figure 4:
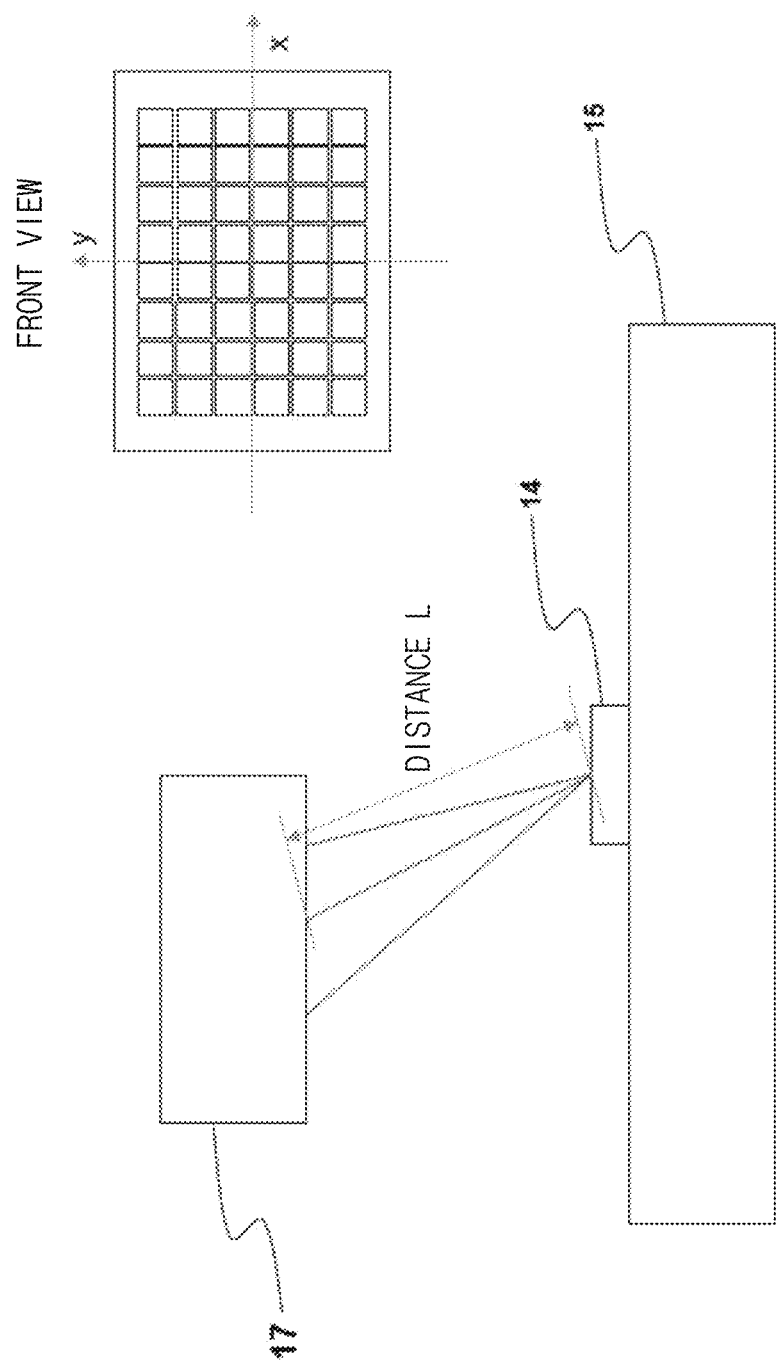
FIG. 4 is a diagram illustrating an example of an array detector portion in the system of measuring an image of a pattern in a scanning type EUV mask, according to an embodiment of the inventive concept.

FIG. 4 is a diagram illustrating an example of an array detector portion in the system of measuring an image of a pattern 14 in a scanning type EUV mask, according to an embodiment of the inventive concept.

A detector portion 17 for detecting the x-ray light may include a detector array, and in order to effectively emulate a structure of an illuminating part of an exposure apparatus, a sensor array in the detector portion may be designed to have a radial structure or a checkerboard shape.

An aerial image, which is reconstructed through a process of measuring light using one of devices in the detector array, may be controlled to obtain an image optimized by adjusting a gain value of each pixel, and this will be described in more detail with reference to FIG. 8. In addition, an illumination property of an oblique optical system may be represented by sigma $(\sigma)=(\theta/NA)$. Here, $\theta$ may be an incident angle, and NA may be a numerical aperture. Thus, an inspection apparatus and an exposure apparatus may be configured to have the same illumination property (i.e., sigma $(\sigma)$), and in this case, the result inspected by the inspection apparatus may be used in the exposure apparatus as it is.

FIG. 5 is a diagram illustrating an example, in which the x-ray spherical mirror and the x-ray flat mirror are placed in a different order from that in FIG. 1, according to another embodiment of the inventive concept. Even when, as shown in FIG. 5, the positions of the x-ray spherical mirror and the x-ray flat mirror are exchanged, it may be possible to realize a scanning system having the same performance. In addition, although not shown in the drawings, the IR flat mirror 2 and the IR spherical mirror 3 may be placed at exchanged positions and may be realized to have the same performance. Since this change in order of the mirrors is included in an embodiment of the inventive concept, it may be within a scope of the present invention.

Figure 6:
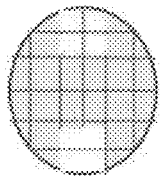
FIG. 6 is a diagram illustrating an example of an image obtained by an array detector portion according to an embodiment of the inventive concept.
Figure 6:
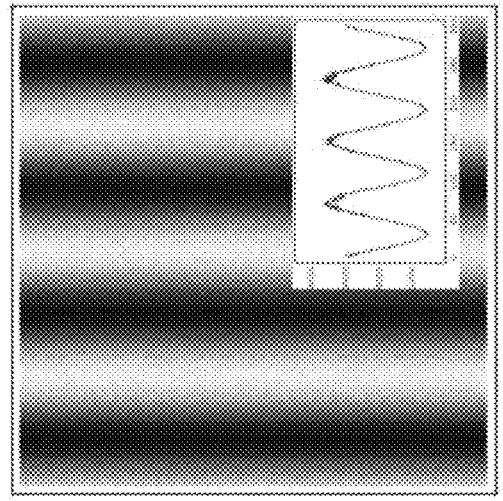
Figure 6:
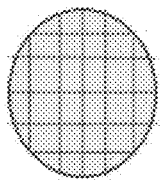
Figure 6:
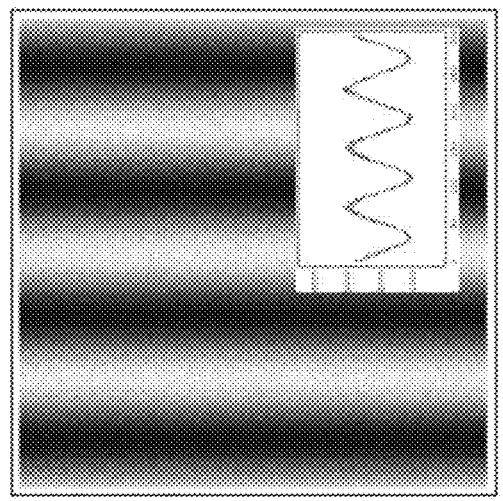

As illustrated in FIG. 6, a detector portion of an array cell structure may be used to reconstruct an image from signals of all cells, and in the case where only dipole-shaped cells are used to reconstruct the image, there may be an EUV mask pattern capable of improving a contrast property of a corresponding signal value. In this case, by exploiting only the dipole cell, it may be possible to increase precision of line-width roughness (LWR). That is, it may be possible to emulate an illuminating part that is optimized to a shape of a pattern.

Here, if a gain value of a dipole-shaped cell, which is placed at the outside, is adjusted to 0, the image reconstruction may be achieved using only the dipole-shaped cell, and this will be described in more detail below.

Figure 7:
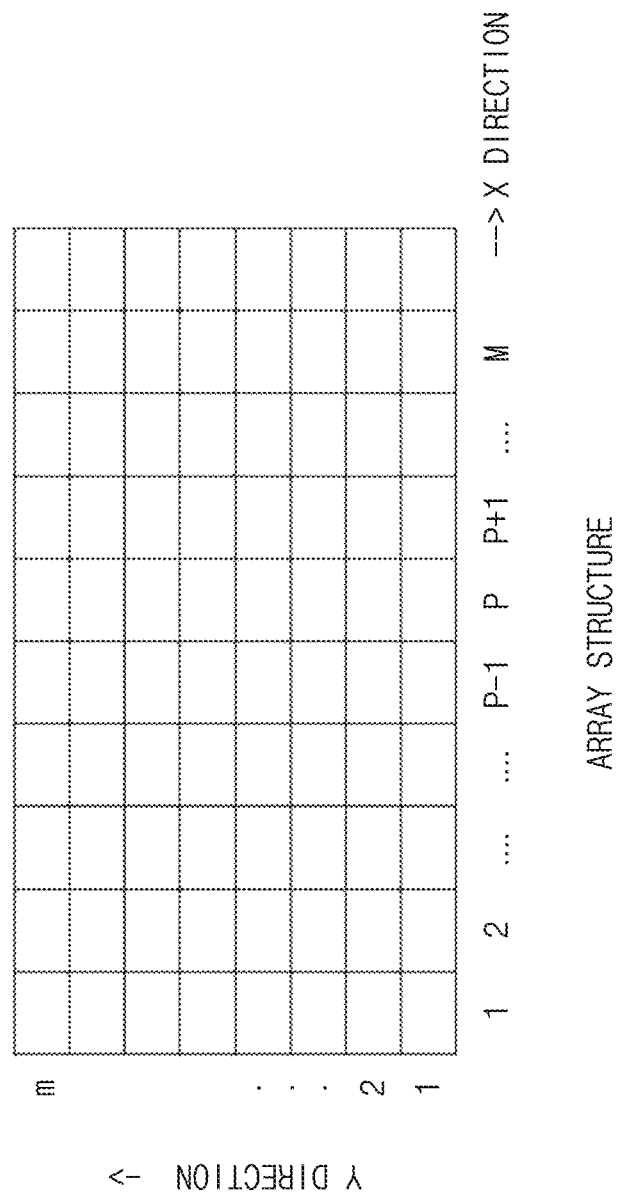
FIG. 7 is a diagram illustrating an array detector portion according to an embodiment of the inventive concept.

FIG. 7 is a diagram illustrating an array detector portion according to an embodiment of the inventive concept. In the exposure apparatus, by changing an intensity of light to an incident angle of a beam incident into a mask (sample), it may be possible to adjust resolution of an image, which is obtained through a beam reflected from the mask. To increase the resolution of an image projected on a wafer, an expensive exposure apparatus may be manufactured to change an intensity of a beam incident into the mask (sample) depending on an incident angle in a hardware manner, but it is not easy to actually manufacture a mask inspection device, in which an intensity of the beam incident into the mask (sample) is changed depending on an incident angle. Thus, in the inspection device, a gain value of each pixel in an array, which is used to measure the shape of the beam reflected from the mask, may be controlled to obtain an equivalent effect of changing the intensity of light to an incident angle of the beam incident into the mask. The controlling of the gain value of each pixel in the array may be equivalent to changing the intensity of light to the incident angle of the beam incident into the mask in a hardware manner, and thus, even in the inspection device, it may be possible to obtain a clear image.

That is, an obtained light intensity I_s(i, j), which is calculated and obtained by the detector array, may be given to satisfy the following equation 1, and in this case, the obtained light intensity may be used to design an illuminating part of a wafer exposure apparatus.

$$I\_s(i,j)=\alpha(i,j)*I\_o(i,j)$$ [Equation 1]

where i is an index in an x direction and is one of 1, 2, p−1, p, p+1, . . . , m, j is an index in a y direction and is one of 1, 2, q−1, q, q+1, . . . , n. In addition, I_o(p, q) is an intensity of light measured at coordinates (p, q), α(p, q) is a pixel gain value at the coordinates (p, q), an obtained light intensity I_s(p, q) is a product of the intensity I_o(p,q) and the gain value α(p, q). In addition, gain values of pixels may be controlled such that all of them are the same or are different from each other or some of them are the same or different from each other, and by controlling the gain values of pixels in various manners, it may be possible to adjust a real value, which is obtained from the array, to a desired value. By adjusting a gain value of each pixel in the array in such a manner, it may be possible to realize a clear image on an inspection device, to apply the result to an actual exposure apparatus, and thereby to effectively execute an inspection process.

According to the afore-described embodiment, by obtaining a high-quality aerial image, it may be possible to previously evaluate whether a defect on an EUV mask is copied to a wafer in a wafer exposure apparatus and thereby to prevent a lot of wafer-level defects from being caused by a defect of a mask pattern. This may make it possible to increase a wafer yield.

According to an embodiment of the inventive concept, it may be possible to improve an optical property (e.g., aberration), optical efficiency, and performance of the aerial image measuring system, compared with the conventional aerial image measuring system. In addition, by using an array detection manner, it may be possible to measure an aerial image that is technically the same as an aerial image by a complex illumination system for emulating an illuminating system of an exposure apparatus, even when the illumination system is not used. Furthermore, by performing the measurement process just one time, it may be possible to reconstruct aerial images for various illuminating conditions.

Thus, by obtaining an aerial image through a high performance measurement process, it may be possible to previously evaluate whether a defect on an EUV mask is copied to a wafer in a wafer exposure apparatus and thereby to prevent a lot of wafer-level defects from being caused by a defect of a mask pattern. This may make it possible to increase a wafer yield.

While example embodiments of the inventive concept have been particularly shown and described, it will be understood by one of ordinary skill in the art that variations in form and detail may be made therein without departing from the spirit and scope of the attached claims.

What is claimed is:

1. A system of measuring an image of a pattern in a scanning type extreme ultraviolet (EUV) mask, comprising:
    a high-power laser output unit comprising a flat mirror and a spherical mirror, which are used to focus a high-power femto-second laser on a gas cell;
    a coherent EUV light generating portion comprising the gas cell, which is used to generate a coherent EUV light from light output from the high-power laser output unit;
    a pin-hole, a graphene filter, and a zirconium (Zr) filter configured to remove a high-power laser beam from the coherent EUV light;
    a stage, on which a reflection-type EUV mask is placed, and which is configured to move the reflection-type EUV mask in a direction of an x-axis or y-axis;
    an x-ray spherical mirror configured to focus the coherent EUV light on a zone-plate lens and to improve optical efficiency;
    a zone-plate lens placed between the stage and the x-ray spherical mirror to focus a reflected portion of the coherent EUV light on a region of the reflection-type EUV mask;
    an x-ray flat mirror placed between the zone-plate lens and the x-ray spherical mirror to guide and reflect a beam, which is focused by the x-ray spherical mirror, to the zone-plate lens;
    an order sorting aperture (OSA) placed on the stage and configured to transmit only a first-order diffraction light of the focused coherent EUV light; and
    a detector portion placed on the stage and comprising a sensor array, which is configured to sense an energy distribution of the coherent EUV light according to an angle of the reflected portion of the coherent EUV light, when the transmitted first-order diffraction light, which is a portion of the focused coherent EUV light, is reflected by the region of the reflection-type EUV mask.

2. The system of claim 1, wherein the detector portion comprises a detector array,
    an obtained light intensity I_s(i, j), which is obtained by a calculation in the detector array, is given to satisfy the following equation, $$I\_s(i,j)=\alpha(i,j)*I\_o(i,j)$$

where i is an index in an x direction and is one of 1, 2, p−1, p, p+1, . . . , m,
j is an index in a y direction and is one of 1, 2, q−1, q, q+1, . . . , n,
I_o(p, q) is an intensity of light measured at coordinates (p, q),
α(p, q) is a pixel gain value at the coordinates of (p, q), and
wherein the obtained light intensity I_s(p, q), which is obtained by the detector array, is given by a product of the intensity of light I_o(p, q) and the pixel gain value α(p, q), and
the obtained light intensity is used to design an illuminating part of a wafer exposure apparatus.

3. The system of claim 1, wherein the pin-hole, the graphene filter, and the Zr filter are simultaneously applied between first optical system in the high-power laser output unit and second first optical system including the x-ray flat mirror and the x-ray spherical mirror to filter an x-ray light from light including a femto-second laser beam and the x-ray light.

4. The system of claim 3, wherein the pin-hole is a filter using a difference in emission angle between a femto-second laser and an x-ray light,
- the Zr filter is configured to use high selectivity between a laser light and an x-ray light, and
- the graphene filter is provided to have a good thermal durability and thereby to reduce a thermal damage issue in a subsequent step.

5. The system of claim 1, wherein all of the zone-plate lens, the order sorting aperture, and the reflection-type EUV mask are disposed in a horizontal structure,
- the order sorting aperture is a pin-hole and is placed between the zone-plate lens and the EUV mask to transmit only the first-order diffraction light, among light focused on the EUV mask through the zone-plate lens, and
- a distance between the order sorting aperture and the reflection-type EUV mask is configured to be smaller than $1/8$ of a distance between the zone-plate lens and the reflection-type EUV mask and to reduce a noise component, except for a focusing component, to a level smaller than 4%.

* * * * *